(12) United States Patent
Poris

(10) Patent No.: US 6,710,888 B1
(45) Date of Patent: Mar. 23, 2004

(54) METHOD OF MEASURING DISHING

(75) Inventor: Jaime Poris, Los Gatos, CA (US)

(73) Assignee: Nanometrics Incorporated, Milpitas, CA (US)

( * ) Notice: Subject to any disclaimer, the term of this patent is extended or adjusted under 35 U.S.C. 154(b) by 0 days.

(21) Appl. No.: 09/578,798

(22) Filed: May 23, 2000

(51) Int. Cl.⁷ .................. G01B 11/14; G01B 11/02; H01L 21/00

(52) U.S. Cl. .................. 356/625; 356/511; 438/7

(58) Field of Search .................. 356/511, 625, 356/601; 438/7

(56) References Cited

U.S. PATENT DOCUMENTS

| | | | |
|---|---|---|---|
| 4,512,661 A | 4/1985 | Claus et al. | 356/351 |
| 5,314,843 A | 5/1994 | Yu et al. | 437/225 |
| 5,348,002 A | 9/1994 | Caro | 128/633 |
| 5,555,471 A | 9/1996 | Xu et al. | 356/357 |
| 5,604,591 A | 2/1997 | Kitagawa | 356/351 |
| 5,784,163 A | 7/1998 | Lu et al. | 356/351 |
| 5,872,629 A | 2/1999 | Colvard | 356/349 |
| 5,874,318 A | 2/1999 | Baker et al. | 438/8 |
| 5,914,782 A | 6/1999 | Sugiyama | 356/351 |
| 5,953,115 A | 9/1999 | Landers et al. | 356/237 |
| 5,983,167 A | 11/1999 | Ebisawa | 702/167 |
| 6,194,317 B1 * | 2/2001 | Kaisaki et al. | 438/692 |
| 6,238,592 B1 * | 5/2001 | Hardy et al. | 252/79.1 |
| 6,340,602 B1 * | 1/2002 | Johnson et al. | 438/7 |
| 6,392,749 B1 | 5/2002 | Meeks et al. | 356/381 |
| 6,392,752 B1 | 5/2002 | Johnson | 356/511 |
| 6,568,290 B1 | 5/2003 | Poris | 73/866 |
| 6,623,991 B2 * | 9/2003 | Johnson et al. | 438/7 |
| 2002/0174714 A1 * | 11/2002 | Mcwaid et al. | 73/105 |

FOREIGN PATENT DOCUMENTS

| | | |
|---|---|---|
| EP | 0 831 295 A1 | 3/1998 |
| EP | 0 982 774 A2 | 3/2000 |
| WO | WO 00/54325 | 9/2000 |

OTHER PUBLICATIONS

Azzam, R. et al., "Ellipsometry And Polarized Light" *Elsevier Science B.V.* (1977, 1987), pp. 282–287.

Fujiwara, H. et al., "Depth–profiles in compositionally–graded amorphous silicon alloy thin films analyzed by real time spectroscopic ellipsometry" *Elsevier Science S.A.* pp. 474–478 (1998).

(List continued on next page.)

*Primary Examiner*—Georgia Epps
*Assistant Examiner*—William Choi
(74) *Attorney, Agent, or Firm*—Silicon Valley Patent Group LLP

(57) ABSTRACT

A metrology process, in accordance with the present invention, measures the dishing of an opaque feature with respect to a relatively transparent feature that surrounds the opaque feature on a production substrate by measuring only height variation of the opaque feature. The opaque feature may be, for example, a metal or metal alloy line containing, e.g., copper, aluminum, or tungsten, while the relatively transparent feature is a dielectric material. The metrology process is useful, for example, after the metal and dielectric materials undergo a polishing process, e.g., CMP, to approximately planarize the surface. The method includes generating a set of calibration data or curves that correlate the magnitude of dishing with the width of a metal line and the profile, shape, or height variation of the metal line. In addition, different sets of calibration data may be generated based on different parameters used in the polishing process. The height variation of the metal line is measured using, e.g., a differential interferometer or a laser displacement sensor. The height variation may be described using a set of data, a curve, an average radius of curvature or a more complicated mathematical description. The height variation is then correlated with the calibration data to determine the magnitude of dishing as well as the amount of dielectric erosion.

19 Claims, 4 Drawing Sheets

OTHER PUBLICATIONS

Heavens, O. S., "Optical Properties of Thin Solid Films" *Dover Publications, Inc* .(1991), pp. 62–73.

Jennewin, H. et al., "Interferometrical Profilometry at Surfaces with Varying Materials" *SPIE* vol. 3677 (1999), pp. 1009–1016.

Kildemo, M. et al., "Measurement of the absorption edge of thick transparent substrates using the incoherent reflection model and spectroscopic UV—visible—near IR ellipsometry" *Elsevier Science S.A.* pp. 108–113 (1998).

Kim, Gee–Hong et al., "White light scanning interferometry for thickness measurement of thin film layers" *SPI* vol. 3783 (1999), pp. 239–246.

Makosch, G. et al., "Surface profiling by electro–optical phase measurements" *SPIE* vol. 316 (1981); pp. 42–53.

"Numerical Recipes, The Art of Scientific Computing" by Press, Flannery, Teukolsky and Vetterling, published by Cambridge University Press 1988, 3.2 Rational Function Interpolation and Extrapolation, pp. 83–85.

Stine, B. et al , "Rapid Characterization and Modeling of Pattern–Dependent Variation in Chemical–Mechanical Polishing", IEEE Transactions on Semiconductor Manufacturing, vol. 11, No. 1, pp. 129–140 (Feb. 1998).

Malacara, Daniel et al. "Interferogram Analysis For Optical Testing" 1998, Marcel Dekker, Inc. pp. 113.

* cited by examiner

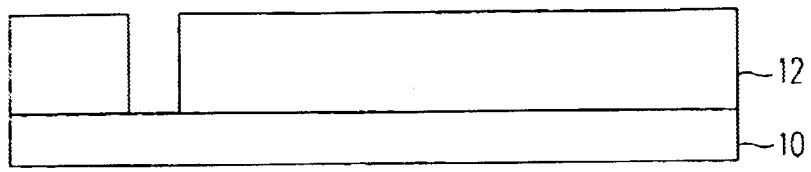
FIG. 1A
(Conventional)
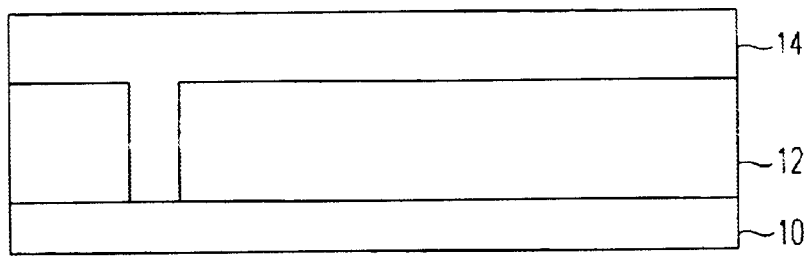
FIG. 1B
(Conventional)
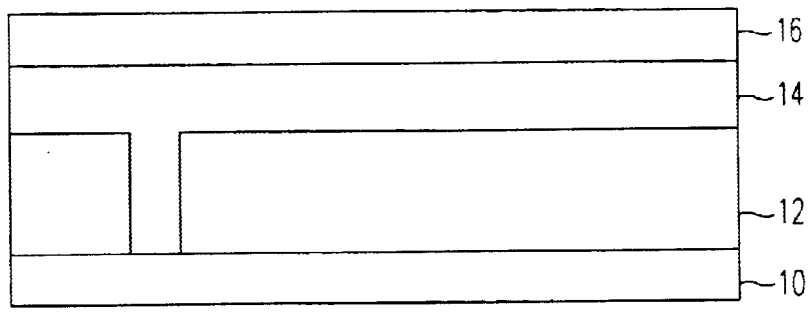
FIG. 1C
(Conventional)
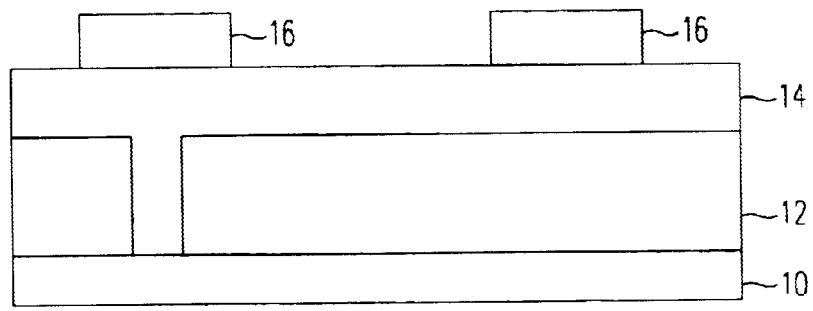
FIG. 1D
(Conventional)
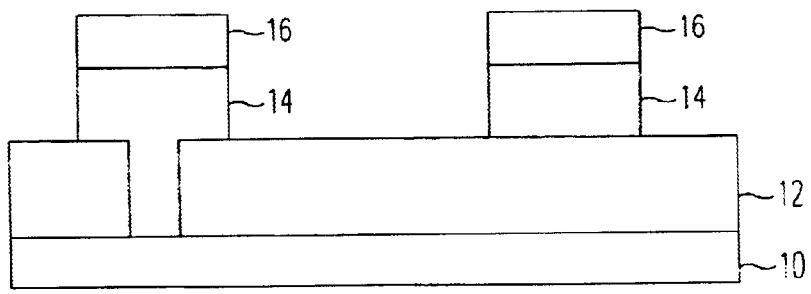
FIG. 1E
(Conventional)

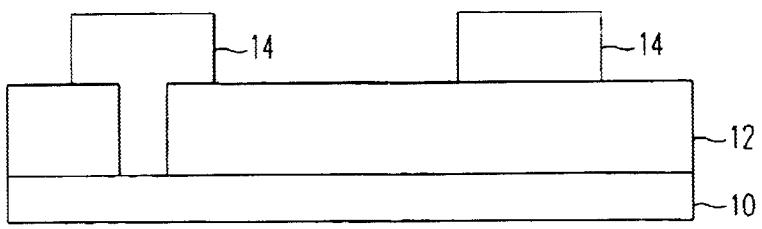
FIG. 1F
(Conventional)
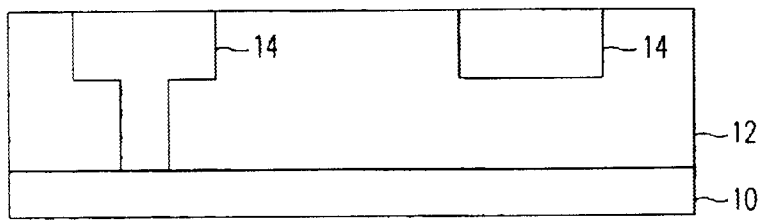
FIG. 1G
(Conventional)
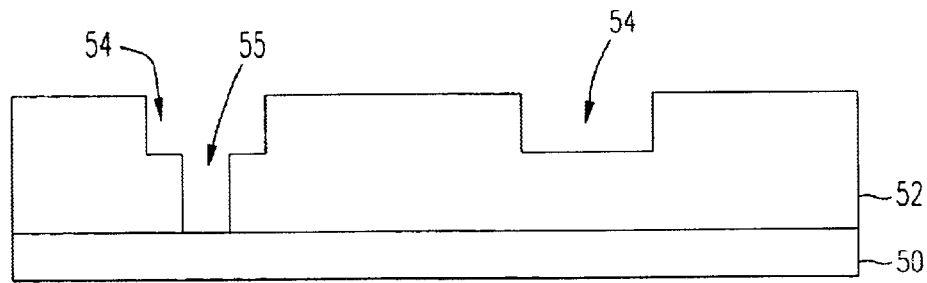
FIG. 2A
(Conventional)
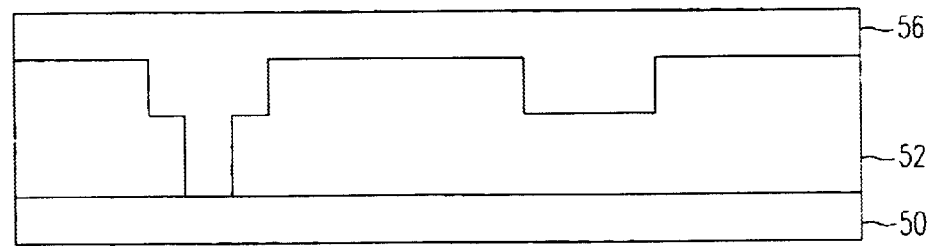
FIG. 2B
(Conventional)
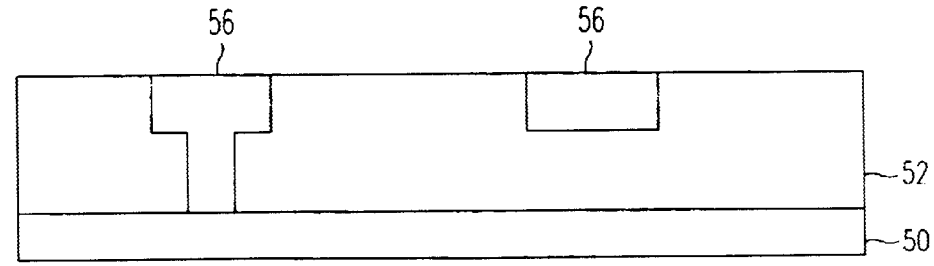
FIG. 2C
(Conventional)

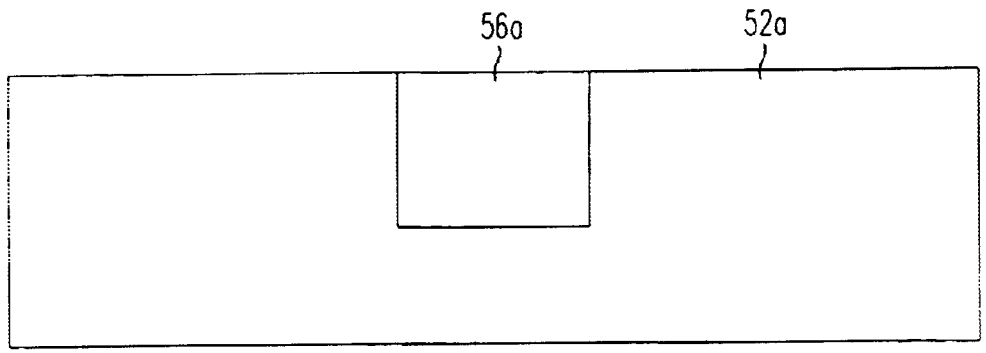
*FIG. 3*
(Conventional)
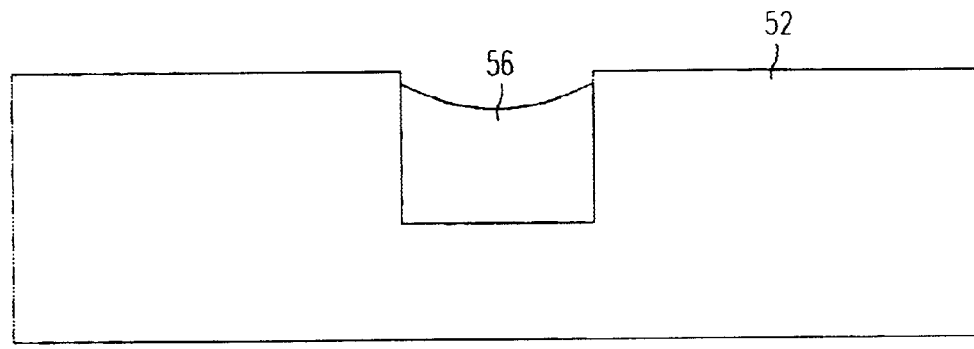
*FIG. 4*
(Conventional)

US 6,710,888 B1

METHOD OF MEASURING DISHING

FIELD OF THE INVENTION

The present invention relates to measuring properties in opaque features, and in particular to a metrology procedure to measure dishing that occurs in opaque features, e.g., after a chemical-mechanical polishing (CMP) step.

BACKGROUND

The metal interconnect of integrated circuits has conventionally been realized by blanket depositing a layer of metal on a planar insulating surface. Portions of the metal layer are subsequently removed in a photolithographically patterned etching step to form the resulting metal conductors. Conventional integrated circuits have generally employed somewhat resistive metal, such as aluminum, or metal alloys for the metal interconnect.

FIGS. 1A through 1G show a cut-away view of the conventional fabrication of an aluminum interconnect. As shown in FIG. 1A, a relatively planar surface layer 10, which may be, e.g., a silicon substrate, is covered with a dielectric layer 12, e.g., an oxide layer, which is patterned and etched. An aluminum layer 14, which may be an aluminum alloy, is blanket deposited over the dielectric layer 12, as shown in FIG. 1B. A photoresist layer 16 is deposited over the aluminum layer 14 (FIG. 1C), and is exposed and developed resulting in the structure shown in FIG. 1D. The aluminum layer 14 is then etched, e.g., using a plasma etching technique, resulting in the structure shown in FIG. 1E. The remaining photoresist layer 16 is removed resulting in the structure shown in FIG. 1F. After these steps are completed, the surface is composed of metal lines with near vertical sidewalls above the surface of the dielectric layer 12, as shown in FIG. 1F. Subsequently, dielectric layers are deposited and chemical mechanical polished (CMP) over the metal lines to yield a dielectric layer 18 with a planarized surface, e.g., for the next metal layer, as shown in FIG. 1G.

A major change is being implemented in semiconductor processing by switching from aluminum to copper metallization. Copper is preferred to aluminum due to its lower resistivity and better electromigration resistance. Unfortunately, copper is difficult to etch and the switch from aluminum to copper has forced a change in the basic metallization process. Copper cannot simply be substituted for aluminum in the metallization process because plasma etching of copper is more difficult than plasma etching of aluminum (due to the lack of volatile copper halogen compounds). Additionally, if copper is allowed to directly contact the dielectric materials, it can rapidly diffuse through dielectric materials and contaminate the semiconductor devices.

Thus, a "damascene" process has been developed whereby copper can be used as the interconnect metal. Rather than blanket depositing the interconnect metal on a substantially planar insulating substrate and then etching away parts of the metal layer to leave the conductors, trenches are formed in an insulating material. A composite layer of a diffusion barrier, nucleation layer and copper are then blanket deposited over the entire surface of the insulating substrate such that the trenches are filled. Chemical mechanical polishing is then used to planarize the integrated circuit surface and thereby polish away all the metal that is not in the trenches the result is metal conductors disposed in trenches and a globally planarized surface.

FIGS. 2A through 2C show a cut-away view of the conventional fabrication of a copper interconnect. As shown in FIG. 2A, a relatively planar surface layer 50, which may be. e.g., a silicon substrate, is covered with a dielectric layer 52. e.g., an oxide layer, which is patterned and etched. The dielectric layer 52 may be patterned and etched in multiple steps in order to produce trenches 54 and via 55. A diffusion barrier layer (not shown), nucleation layer (not shown), and copper layer 56 are blanket deposited over the dielectric layer 52 such that the trenches 54 and via 56 are filled, as shown in FIG. 2B. A chemical mechanical polishing step is then used to planarize the surface of the copper layer 56 (along with the diffusion barrier layer and nucleation layer) with dielectric layer 52, resulting in the structure shown in FIG. 2C.

The ideal copper CMP process removes the copper, nucleation layer and diffusion barrier from the surface of the dielectric while leaving behind the copper, nucleation layer and diffusion barrier in the trenches and contacts or vias. The ideal result would be a globally planarized surface with no vertical height change over the entire wafer surface. FIG. 3 shows the ideal resulting structure with a planar surface composed of a dielectric region 52a and idealized copper region 56a. Global planarity is desirable because of the depth of field requirements associated with the lithographic Step. Significant height variations on the surface will compromise the photoresist processing steps and subsequently the etching and metallization processes. Height variations also imply undesirable variations in the copper thickness and metal line resistance.

Untortunately, because of the complexities associated with the CMP process, global planarity is not achievable. An artifact of the CMP process in copper metallization results from the copper and dielectric material having different polishing rates, resulting in what is known as "dishing". FIG. 4 shows a cut-away side view of the typical resulting structure after the CMP process, in which the surface of the copper region 56 is lower than the surrounding dielectric region 52. It should be understood that FIG. 4 is for exemplary purposes and is not to scale. Dishing may generally be defined as the maximum height difference between the metal region 56 and the adjacent dielectric region 52 after CMP processing.

Another artifact caused by the CMP process, as known to those of ordinary skill in the art, is "dielectric erosion," i.e., the dielectric regions exhibit a chance in height over the surface of the wafer. This variation is related to the local density of metal features. Areas of low metal density exhibit the highest dielectric surface regions whereas areas of high metal density result in lower dielectric surface regions. Dielectric erosion, however, is beyond the scope of this disclosure.

The processing of silicon wafers to form integrated circuit chips requires many complex processing steps. Each step must be carefully monitored and controlled to maximize the quality and yield of the final product. With the imminent replacement of aluminum by copper to form the metallization layers on silicon wafers, new processes and metrology techniques must be developed and implemented.

Accordingly, what is needed is an economical, reliable, rapid, precise and accurate metrology procedure that will characterize and control the individual process steps in the copper metallization process and specifically that will address dishing that results from certain polishing methods, such as the CMP process.

SUMMARY

A metrology process, in accordance with the present invention measures the dishing of a first feature. e.g., an opaque or metal line, that is surrounded by a second feature, e.g., a dielectric layer, on a production substrate by measuring only height variations of the opaque feature. The opaque feature may be, for example, a metal or metal alloy line containing, e.g., copper, aluminum, or tungsten, while the relatively transparent feature is a dielectric material. The metrology process is useful, for example, after the metal and dielectric materials undergo a polishing process, e.g., CMP, to approximately planarize the surface. The method includes generating a set of calibration data or curves that correlate the magnitude of dishing with the width of a metal line and the profile, shape or height variation of the metal line. In addition, different sets of calibration data may be generated based on different parameters used in the polishing process. The height variation of the metal line is measured using, e.g., a differential interferometer or a laser displacement sensor. The height variation may be described using a set of data, a curve, an average radius of curvature or a more complicated mathematical description. The height variation is then correlated with the calibration data to determine the magnitude of dishing. This calibration based process is particularly useful in measuring dishing due to the complexities associated with that measurement and the inability of conventional techniques to adequately measure dishing.

The calibration data or curves are produced by providing a set of sample substrates having different widths of metal lines. The sample substrate is processed in a manner similar to that of the production substrate to produce dishing in the metal lines. Thus, for example, the sample substrate is polished using a CMP process. The dishing of the metal lines is then directly measured using, e.g., an atomic force microscope or a contact profilometer. The measured dishing of the different metal lines can then be related to the different values of widths, densities, as well as the profile shape of the metal lines. Additional sets of calibration curves may be generated using different parameter settings for the CMP process.

BRIEF DESCRIPTION OF THE DRAWINGS

FIGS. 1A through 1G show a cut-away view of the conventional fabrication of an aluminum interconnect.

FIGS. 2A through 2C show a cut-away view of the conventional fabrication of a copper interconnect.

FIG. 3 shows a cut-away view of the ideally planar metal and dielectric regions resulting from a polishing process.

FIG. 4 shows a cut-away view of the typical resulting structure after a CMP process showing dishing of the metal region.

DETAILED DESCRIPTION

A metrology process, in accordance with the present invention, determines the amount of dishing of a feature on the surface of a flat substrate by comparing the measured shape of the feature against a set of predetermined calibration curves. This method is useful on substrates composed of more than one material, such as a metal (or metal alloy) and a dielectric material, and may be used for semiconductor wafers, flat panel displays, or other similar flat substrates. The present metrology procedure can quantify dishing to fully characterize the shape of the surface after, e.g., a CMP process, in a fast, precise, accurate, reliable and economical manner.

While it is preferred to directly measure the actual height difference between the metal and adjacent dielectric regions to quantify the dishing, direct measurement of the surface height of the copper feature and the dielectric feature with a form of radiation is difficult because these two materials respond in a complex manner to radiation. The copper material is essentially opaque to most forms of radiation and produces a material specific phase shift, while the dielectric material is partially transparent to most forms of radiation that are used for measurement purposes and also modifies the phase response in a complex manner. Layers or features buried in the dielectric layer may interfere with reflected signals making analysis of the dielectric surface difficult. A detailed measurement using, e.g., an ellipsometer, is necessary to understand the complex modification of the phase shift of the dielectric material. Metrology processes that may be used to measure the surface height of the dielectric region, however, are unsatisfactory due to cost, throughput and/or performance factors. Accordingly, only the surface of the copper feature is measured to quantify dishing in accordance with the present invention, which advantageously avoids complexities associated with measuring the reflected signal from the transparent dielectric surface.

While the present disclosure discusses the measurement of dishing of an opaque or metal material that is surrounded with a transparent or dielectric material, it should be understood that the present invention may be used to measure the dishing of a first feature surrounded by a second feature, where the first and second features both modify the phase shift in a complex manner. Thus, for example, the first and second features may both be transparent. By measuring only the first feature, complexities associated with measuring the signal from the second feature are advantageously avoided.

As only the surface of the metal feature is used to determine the amount of dishing, it is important to note a few characteristics of the metal feature after the CMP process.

Figure 5:
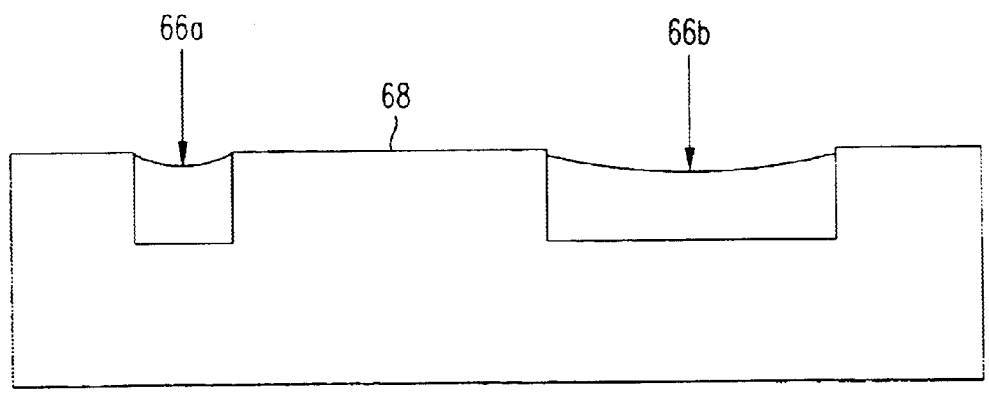
FIG. 5 shows a cut-away view of the typical resulting structure after a CMP process showing a profile of the dishing of a narrow, isolated metal line and a wide, isolated metal line.

FIG. 5 shows a cut-away view of the typical resulting structure after a CMP process showing a profile of the dishing of a narrow, isolated metal line 66a and a wide, isolated metal line 66b. As shown in FIG. 5, the magnitude of dishing increases with the size of the metal feature. The greatest amount of dishing occurs at the center of the metal features 66a and 66b, i.e., the maximum distance from the surrounding dielectric area, while the least amount of dishing occurs adjacent to the dielectric region 68. Consequently, the metal feature 66 surface forms a complex, concave shape.

In one embodiment of the present invention, dishing is characterized by assigning an average radius of curvature to the profile of the metal features. Thus, as shown in FIG. 5, a narrow metal feature 66a exhibits a small average radius of curvature while a wide metal feature 66b exhibits a large average radius of curvature.

Of course, in other embodiments, more mathematically complex analysis may be used to describe the profile of the metal features compared to a simple average radius of curvature.

Thus, the following relationships are observed for different areas on a wafer with respect to dishing: dishing is a function of parameters associated with the CMP process, dishing is directly proportional to metal line width, and dishing is inversely proportional to the average radius of curvature.

Figure 6:
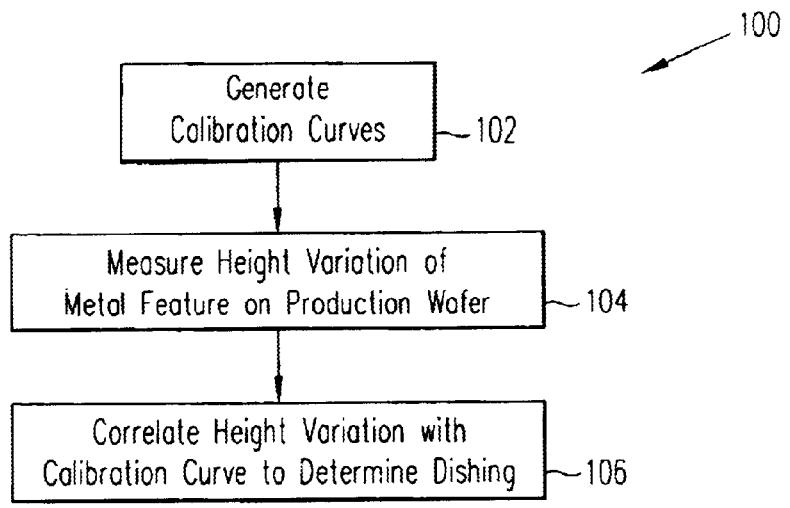
FIG. 6 is a flow chart describing the metrology process of the present invention.

The metrology process, in accordance with the present invention, determines the amount of dishing of the metal feature by comparing the measured profile shape of the metal feature against a set of predetermined calibration curves. FIG. 6 is a flow chart 100 describing the metrology process of the present invention. As shown in FIG. 6, a set of calibration data is generated (block 102). The calibration data may be stored as raw data or may be stored as a curve, and thus will hereinafter be referred to as calibration curves. The calibration curves correlate the relationship between the CMP parameters, the metal line width, average radius of curvature and dishing. Important CMP parameters, for example, are related to the ratio of the chemical to the mechanical components of polishing process, such as slurry chemistry and pad composition. The calibration curves may be stored, e.g., in a database and are accessible during the metrology process.

The height variation i.e., the profile shape, of a metal feature on a production wafer is measured (block 104). A number of methods may be used to measure the height variations of the metal feature. The width of the metal features will already be known.

One such method uses a differential interferometer. As is well known in the art, one type of differential interferometer works by splitting a laser beam into two orthogonally polarized components. Each spot then hits the sample at normal incidence with a pre-determined spacing. After reflection from the surface of the sample, the two spots are recombined before hitting a detector. If there is a height difference between the two spots on the sample, there will be a relative change in the phase difference between the two spots upon recombining that will modify the amplitude of the signal hitting the detector. By modulating the phase of one spot relative to the other during the measurement, the actual step height can be calculated with the additional knowledge of the laser wavelength and any phase shifts associated with dielectric materials or different materials beneath the two spots. The local change in slope or height can be measured as the two small, adjacent spots traverse a metal feature. The shape of the metal feature can be determined from a plurality of measurements. The radius of curvature (or a more complex mathematical entity) can then be calculated from the shape of the feature.

Another apparatus that may be used to measure the height variation of a metal feature on a production wafer is a laser displacement sensor. As is well known in the art a laser displacement sensor focuses a small laser spot onto the metal feature. The position of the reflected beam is then measured. This is repeated as the beam is scanned across the metal feature. The positional data can then be converted to an average radius of curvature.

Ideally, the height variation of metal features will be measured in areas on the wafer that are composed of the metal, e.g., copper or copper alloy layer, the dielectric layer in which the metal was inlaid and the underlying silicon substrate without additional features present between the copper layer and the substrate. If these specific areas cannot be located on the wafer or if it is desirable to avoid the complexity associated with these areas, measurements may be made of copper features that have polysilicon lines and/or metal features below and adjacent to the copper and the substrate using the present invention without degrading the measuring signal from the top surface.

Because dishing is a measure of the height difference between the surrounding dielectric material and the metal feature, the measured profile shape of only the metal feature on the production wafer is not the measurement of the dishing. There is an unknown height variation at the interface between the dielectric material and the metal feature. Thus, to determine the amount of dishing, i.e., the height difference between the surrounding dielectric and the metal feature, the profile shape of the metal feature is compared to the calibration curves (block 106)

Figure 7:
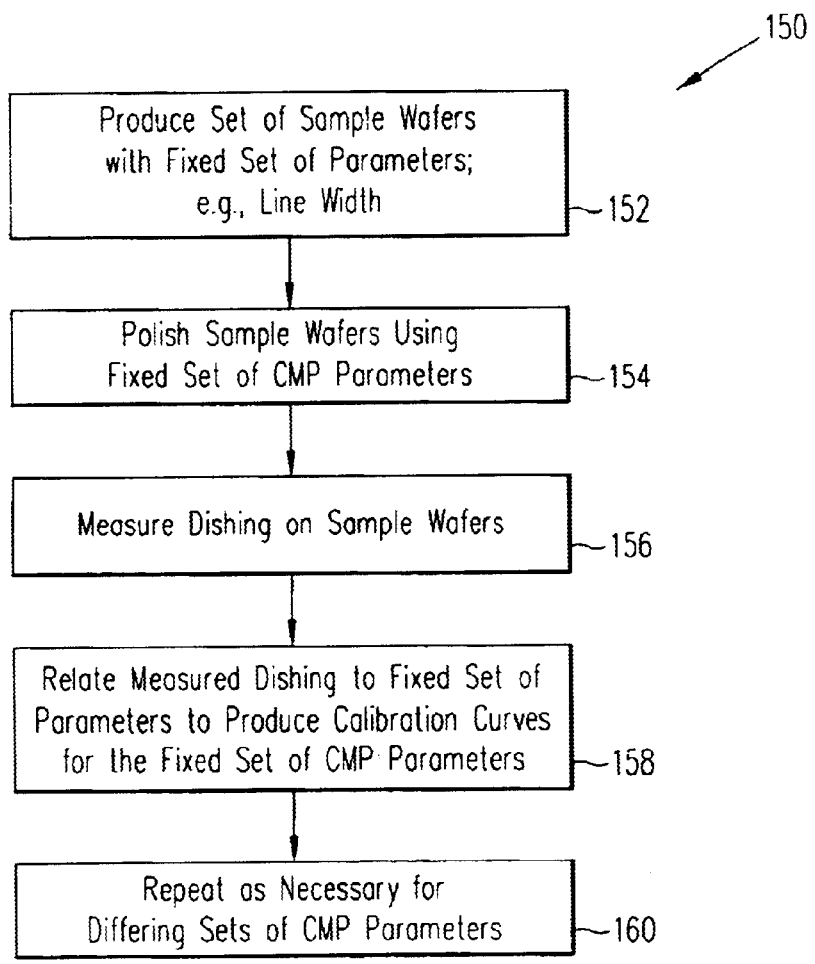
FIG. 7 is a flow chart describing the process of generating a set of calibration curves to be used in accordance with the present invention.

FIG. 7 is a flow chart 150 describing the process of generating a set of calibration curves to be used in accordance with the present invention. A set of sample wafers is produced (block 152). Each sample wafer should include a fixed set of parameters, such as different line widths, and ideally should be as close as possible to the production water that is to be measured. To generate a useful set of calibration curves, a properly chosen number of experiments should be run on the sample wafers, with each experiment using a fixed set of CMP parameters. The sample wafers are polished using a fixed set of commonly used CMP parameters (block 154).

The dishing on the sample wafers is then independently measured using. e.g., a calibrated atomic force microscope or contact profilometer (block 156). The independent measurement of the amount of dishing is then quantitatively related to the fixed set of parameters, e.g., metal line width, average radius of curvature and dishing (block 158). The experiments should be repeated at other values of important CMP parameters to determine if the relationship between dishing and the average radius of curvature is modified by the CMP processing parameters (block 160). After generating an adequate set of calibration curves, measurements can then be made at a multitude of specific areas on a production wafer to quantify dishing by comparing the results to the set of calibration curves.

Although the present invention is illustrated in connection with specific embodiments for instructional purposes, the present invention is not limited thereto. Various adaptations and modifications may be made without departing from the scope of the invention. For example, the inlaid metal features may be made of copper, aluminum, tungsten or any other appropriate metal or metal alloy. While the present disclosure discusses the measurement of dishing of an opaque or metal material that is surrounded with a transparent or dielectric material, the present invention may also be used to measure the dishing of a first feature that is surrounded by a second feature, where the first and second features both modify the phase shift in a complex manner. Thus, for example, the first and second features may both be transparent. The metrology process in accordance with the present invention is not limited to measuring dishing after a CMP process, but may be used after any process where dishing takes place. Further, the calibration curves produced using the sample wafers may be stored in a database and retrieved when performing measurements. Moreover, it should be understood that metrology process may be used with wafers, flat panel displays or any other device in which the measurement of dishing is desirable. Therefore, the spirit and scope of the appended claims should not be limited to the foregoing description.

What is claimed is:

1. A method of measuring the dishing of a first feature that is surrounded by a second feature on a substrate, said method comprising:

generating a set of calibration data;

measuring the height variation of said first feature on said substrate; and correlating the height variation of said first feature with said calibration data to determine the amount of dishing of said first feature.

2. The method of claim 1, wherein said measuring the height variation of said first feature is performed after a polishing process is used.

3. The method of claim 1, wherein said first feature is a metal feature and said second feature is a dielectric material.

4. The method of claim 3, wherein said metal feature comprises at least one of copper, aluminum, and tungsten.

5. The method of claim 1, wherein generating a set of calibration data comprises:

providing a set of sample substrates having different values of first feature widths;

processing said sample substrates to produce dishing of the first features;

measuring the dishing of said first features on said sample substrates; and producing calibration data by relating the measured dishing to different values of first feature widths.

6. The method of claim 5, wherein processing said sample substrates comprises polishing said sample substrates.

7. The method of claim 6, further comprising generating additional sets of calibration data for different polishing parameters.

8. The method of claim 5, wherein measuring the dishing of said first feature on said sample substrates comprises measuring the dishing using an atomic force microscope.

9. The method of claim 5, wherein measuring the dishing of said first features on said sample substrates comprises measuring the dishing using a contact profilometer.

10. The method of claim 1, wherein measuring the height variation of said first feature comprises utilizing at least one of a differential interferometer and a laser displacement sensor to measure the shape of the first feature.

11. The method of claim 1, wherein said calibration data is provided in the form of calibration curves, and measuring the height variation of said first features further comprises interpreting said height variation as the shape of said first feature, said correlating the height variation of said first feature with said calibration data to determine the amount of dishing of said first feature, comprises:

correlating said shape of said first feature with said calibration curves to determine the amount of dishing of said first feature.

12. The method of claim 11, further comprising associated an average radius of curvature with said shape of said first feature.

13. The method of claim, 11 further comprising associated an average radius of curvature to the amount of dishing from the calibration curves.

14. A method of producing a set of calibration data for comparing to the measured height variation of a first feature surrounded by a second feature on a substrate to determine the amount of dishing of said first feature, the method comprising:

providing at least one sample substrate having a plurality of first features surrounded by said second feature, said first features having differing widths and exhibiting dishing;

measuring the magnitude of dishing of said plurality of first features, and relating said magnitude of dishing to at least one of the first feature widths and the profile shape of said first features.

15. The method of claim 14, further comprising polishing said plurality of first features and surrounding second feature to produce dishing in said first features.

16. The method of claim 15, further comprising relating said magnitude of dishing to the parameters used in said polishing.

17. A method of measuring dishing in a first feature, said method comprising:

providing a substrate having a first feature embedded in a second feature, said first feature and second feature having been polished to approximately planarize the top surface of said first feature and said second feature;

measuring the height variation of said first feature to determine the profile shape of said first feature;

comparing said height variation of said first feature with pre-generated calibration data that relates the magnitude of dishing to the profile shape of a first feature.

18. The method of claim 17, further comprising determining the width of said first feature, wherein said pre-generated calibration data further relates the magnitude of dishing, to the first feature width.

19. The method of claim 17, wherein measuring the height variation of said first feature comprises utilizing at least one of a differential interferometer and a laser displacement sensor to measure the shape of the first feature.

* * * * *